(12) United States Patent
Song et al.

(10) Patent No.: US 11,443,930 B2
(45) Date of Patent: Sep. 13, 2022

(54) SOLID-STATE CHARGE DETECTOR

(71) Applicant: Brigham Young University, Provo, UT (US)

(72) Inventors: Yixin Song, Provo, UT (US); Shiuh-hua Wood Chiang, Vineyard, UT (US); Aaron R. Hawkins, Provo, UT (US); Daniel E. Austin, Mapleton, UT (US)

(73) Assignee: Brigham Young University, Provo, UT (US)

( * ) Notice: Subject to any disclaimer, the term of this patent is extended or adjusted under 35 U.S.C. 154(b) by 276 days.

(21) Appl. No.: 16/889,700

(22) Filed: Jun. 1, 2020

(65) Prior Publication Data

US 2021/0050200 A1 Feb. 18, 2021

Related U.S. Application Data

(60) Provisional application No. 62/916,071, filed on Oct. 16, 2019, provisional application No. 62/888,108, filed on Aug. 16, 2019, provisional application No. 62/887,500, filed on Aug. 15, 2019.

(51) Int. Cl.
| | |
|---|---|
| *H01J 49/02* | (2006.01) |
| *G01R 29/24* | (2006.01) |
| *H03F 3/45* | (2006.01) |
| *H03G 3/30* | (2006.01) |
| *H03F 3/70* | (2006.01) |

(52) U.S. Cl.
CPC ............ *H01J 49/022* (2013.01); *G01R 29/24* (2013.01); *H01J 49/025* (2013.01); *H03F 3/45273* (2013.01); *H03F 3/70* (2013.01); *H03G 3/30* (2013.01)

(58) Field of Classification Search
CPC ...... H01J 49/022; H01J 49/025; G01R 29/24; H03F 3/45273; H03F 3/70; H03F 2203/45428; H03F 2203/45514; H03F 2203/45526; H03F 3/087; H03F 3/45192; H03F 3/45475; H03F 3/45659; H03G 3/30; H03G 1/0094; H03G 3/3084
USPC .................................. 330/252–261; 250/282
See application file for complete search history.

(56) References Cited

U.S. PATENT DOCUMENTS

| | | |
|---|---|---|
| 6,061,093 A | 5/2000 | Yonemoto |
| 2004/0017224 A1 | 1/2004 | Turner et al. |
| 2012/0013351 A1* | 1/2012 | Daniel ..................... G01D 5/24 324/602 |
| 2015/0229856 A1 | 8/2015 | Kasai |

(Continued)

OTHER PUBLICATIONS

PCT International Search Report and Written Opinion for PCT/US2020/035614; dated Aug. 20, 2020, 9 pages.

*Primary Examiner* — Hieu P Nguyen
(74) *Attorney, Agent, or Firm* — Morriss O'Bryant Compagni Cannon, PLLC

(57) ABSTRACT

The present invention is a system and method for providing a charge detector that utilizes small feedback capacitors in a low-noise, high-gain, system that combines a differential topology in a solid-state amplifier implemented in a complementary metal-oxide semiconductor (CMOS) process with active reset, thereby achieving high dynamic range and robust operations. A custom optoelectronic system is used to measure gain, and while operating at a sampling frequency of 10 kHz, the active reset extends the dynamic range of the charge detector.

42 Claims, 16 Drawing Sheets

(56) References Cited

U.S. PATENT DOCUMENTS

2018/0241960 A1 8/2018 Sakakibara et al.
2018/0249098 A1 8/2018 Sakakibara et al.

* cited by examiner

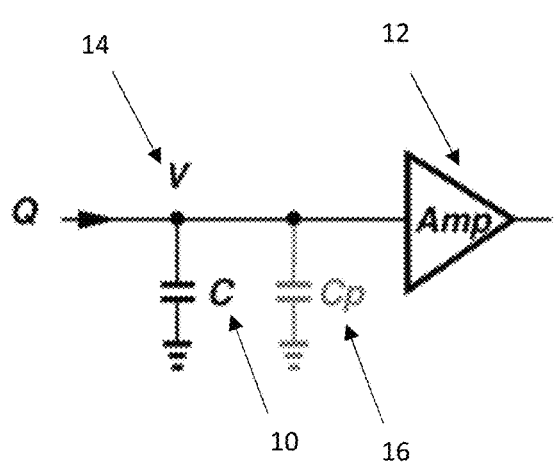
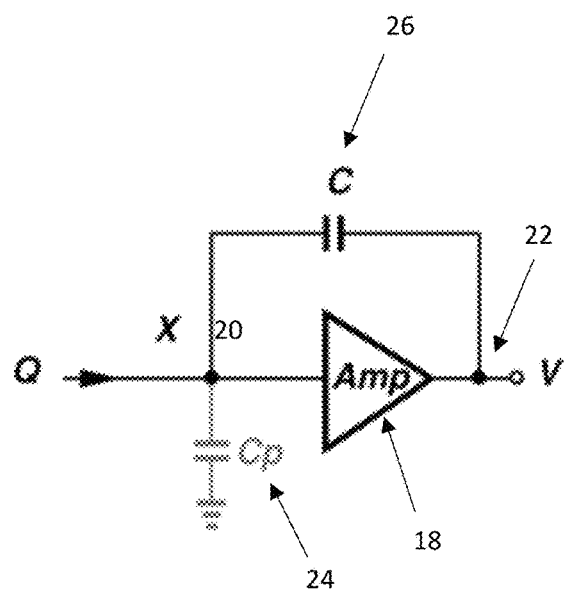
FIGURE 1
PRIOR ART
FIGURE 2
PRIOR ART

|   | $M_1$ | $M_{1-2}$ | $M_{3-4}$ | $M_{5-6}$ | $M_{7-8}$ | $M_{9-10}$ | $M_{11-12}$ | $M_{12-14}$ | $M_{15-18}$ | $M_{19-22}$ |
|---|---|---|---|---|---|---|---|---|---|---|
| W | 14.74 | 440 | 16 | 28 | 60 | 200 | 1.7 | 58 | 18.48 | 73.92 |
| L | 2.52 | 0.18 | 9.48 | 9.76 | 7.1 | 10 | 9.48 | 0.18 | 0.18 | 0.18 |

| Resistance | $R_{1-2}$ | $R_{3-4}$ |
|---|---|---|
|  | 1 K | 16.5 K |

FIGURE 6

SOLID-STATE CHARGE DETECTOR

CROSS-REFERENCE TO RELATED APPLICATIONS

This application claims the benefit of U.S. Provisional Application No. 62/887,500 filed Aug. 15, 2019; U.S. Provisional Application No. 62/888,108 filed Aug. 16, 2019; and U.S. Provisional Application No. 62/916,071 filed Oct. 16, 2019, which are hereby incorporated by reference herein in their entireties, including but not limited to those portions that specifically appear hereinafter, the incorporation by reference being made with the following exception: In the event that any portion of the above-referenced applications are inconsistent with this application, this application supersedes said above-referenced applications.

STATEMENT REGARDING FEDERALLY SPONSORED RESEARCH OR DEVELOPMENT

The invention was made with government support under Grant Number 80NSSC17K0101 awarded by NASA. The government has certain rights in the invention.

BACKGROUND

Field of the Invention

This invention relates generally to charge detection. More specifically, the invention is a charge detector that utilizes a high-gain, differential solid-state amplifier with active reset and a novel technique to measure the gain of a charge amplifier using a custom optoelectronic system.

Description of Related Art

Charge detection is important to a large variety of scientific and commercial applications, including mass spectrometry, DNA processing, and scientific imaging. A number of prior art methods exist for charge detection. One common method is electron multiplication. An electron multiplier (EM) relies on secondary electron emission by collision of electrons with one or more surfaces.

Due to the probabilistic nature of secondary electron creation, these detectors are non-linear in their response and exhibit thermally dependent noise. Furthermore, electron multipliers require a high supply voltage (typically around 1000 V) and a vacuum or near vacuum environment for operation.

Another widely used detection technology in the prior art is an ion detection element (IDEL). IDELs consist of an amplifier circuit connected to a charge-collection electrode. The charge of an incident particle can either be transferred indirectly through an image charge or directly through impact on a conductive surface. Direct impact electrodes are often referred to as Faraday cups and are commonly used in applications such as mass spectrometry where mass-analyzed ions impact a detection electrode. Indirect charge induction methods are used in charge detection mass spectrometry (CDMS) as well as Fourier transform ion cyclotron resonance mass spectrometry and orbitraps.

There are also some less common charge detection methods in the prior art which are worth mentioning. These include altered field effect transistors (FET) and cryogenic detectors.

One of the goals of all of these prior art methods of charge detection is to be as sensitive and precise as possible, with the ideal being the detection of a single electron charge. Such a goal may be realized through maximizing amplification gain while minimizing noise. Nevertheless, it would be an improvement over the prior art to achieve this goal with as little system cost as possible. In the context of charge amplifiers, system cost usually refers to cooling systems, high vacuum levels, and high-precision, high-voltage power supplies. Systems that can minimize these requirements are especially promising for portable applications and instruments used in space.

Lowering noise and increasing sensitivity is an ongoing challenge which has led to techniques meant to take advantage of signal averaging. For example, in CDMS, measurements are taken repeatedly with the same particle, either by cascading multiple stages in series or sweeping the charged particle back and forth through detector cylinders or plates. The repeated measurements allow for noise to be averaged out, thus reducing the noise floor, even below one electron in some cases. While extremely powerful, these techniques are still limited by the performance of the electronics with expensive cooling techniques almost always being a necessity. In some instances, the pressure at which the device operates must also be significantly lowered.

Accordingly, it would be an improvement over the prior art to provide a charge amplifier that may be compatible with CDMS applications, and thus capable of exploiting the noise reduction that comes with repeated measurements. It would be a further improvement if the system could achieve the desired noise performance without the need of device cooling and high-precision, high-voltage power sources, and without lowering pressure.

BRIEF SUMMARY

The present invention is a system and method for providing a charge detector that utilizes small feedback capacitors in a low-noise, high-gain, system that combines a differential topology in a solid-state amplifier implemented in a complementary metal-oxide semiconductor (CMOS) process with active reset, thereby achieving high dynamic range and robust operations. A custom optoelectronic system is used to measure gain, and while operating at a sampling frequency of 10 kHz, the active reset extends the dynamic range of the charge detector.

In a first aspect of the invention, the charge amplifier is the first instance of a charge detector that combines a differential topology, active reset, and small feedback capacitors.

In a second aspect of the invention, the optoelectronic system injects an adjustable input photocurrent to precisely quantify the charge detector's gain without the need for a known calibration capacitance.

In a third aspect of the invention, the charge amplifier is directly wire-bonded to a printed circuit board (PCB) that has a built-in charge collector such as a Faraday cup.

These and other embodiments of the present invention will become apparent to those skilled in the art from a consideration of the following detailed description taken in combination with the accompanying drawings.

BRIEF DESCRIPTION OF THE SEVERAL VIEWS OF THE DRAWINGS

FIG. 1 is an amplifier circuit of the prior art.

FIG. 2 is a modified amplifier circuit of the prior art showing an improved feedback design.

FIG. 6 is a table showing an example of values that were used for the charge detector 30 shown in FIGS. 4, 5A and 5D.

DETAILED DESCRIPTION

Figure 3:
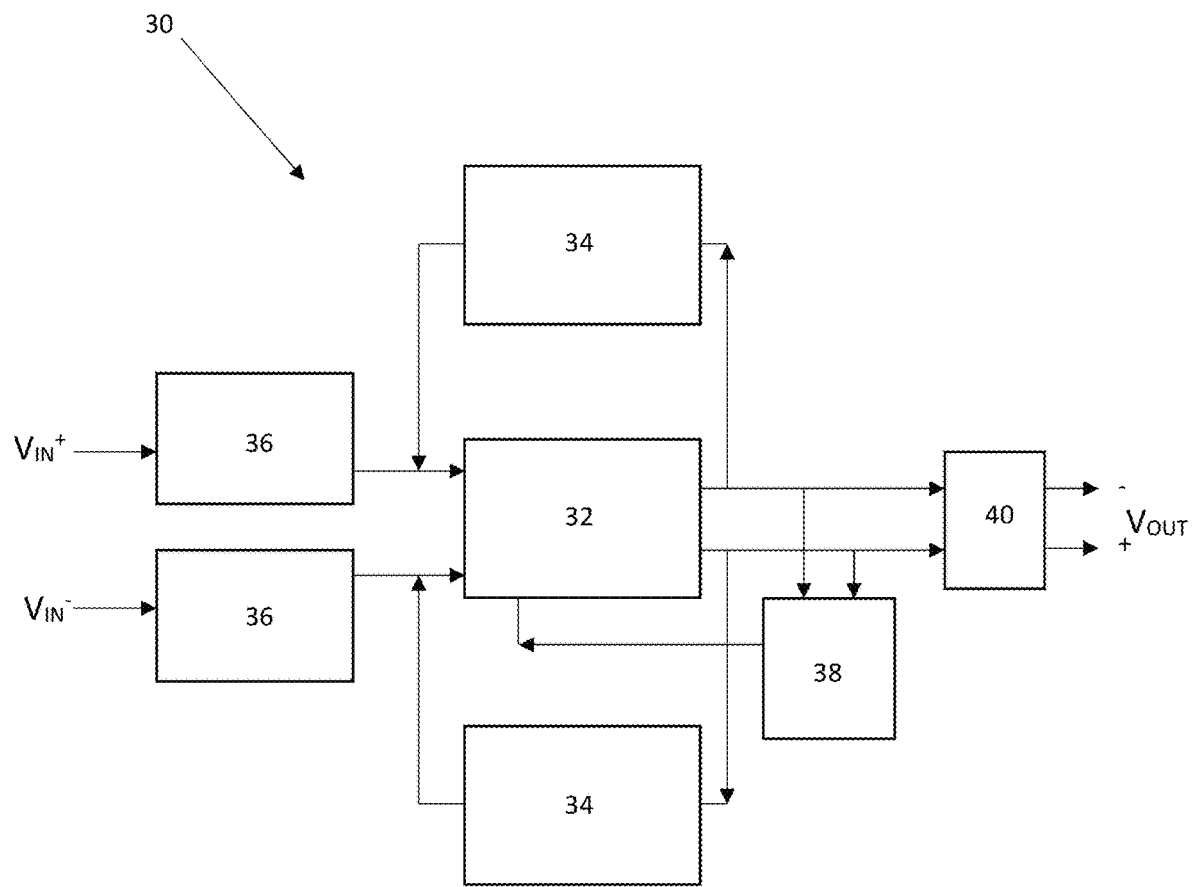
FIG. 3 is a block diagram of the embodiments of the invention.

Reference will now be made to the drawings in which the various embodiments of the present invention will be discussed so as to enable one skilled in the art to make and use the invention. It is to be understood that the following description illustrates embodiments of the present invention and should not be viewed as narrowing the claims which follow.

To introduce the improvement over the prior art of charge detection, it is useful to understand the areas in which greatest improvement is achieved. In the context of IDELs, there may be three common barriers to ideal charge detector performance.

First, many amplifier circuits utilize a feedback capacitor to "collect" the incoming charge. It may be desirable to minimize the feedback capacitance so as to maximize the output voltage to thereby obtain a good signal-to-noise ratio (SNR). However, discrete capacitors available commercially are generally 0.1 pF or larger with impractically large specification tolerances of up to 50%. Other integrated circuits previously reported have similarly large feedback capacitances.

A second performance barrier for IDEL amplifier circuits is that they have typically utilized a single-ended configuration. Single-ended topologies are known to suffer from sensitivity to supply voltage noise, radio frequency (RF) interference, ground loops, self-coupling, etc., thus significantly reducing SNR.

Finally, a last performance barrier may be that contemporary devices may rely on a feedback resistor to passively reset the charge accumulated at the feedback capacitor. However, in applications where large charges are being sensed, or if the frequency of arrival of input charges is high, a passive reset is simply too slow and the amplifier output may quickly saturate, and thus compromising the data acquired.

The embodiments of the invention described herein combine improvements and solutions to all three of these barriers to thereby achieve a charge detector design having substantial benefits over the prior art. The dramatically increased gain afforded by the small feedback capacitance, the improved noise performance of the differential topology, and the flexibility to operate in a variety of charge sensing situations enabled by the active reset make the embodiments of the invention high-performing in a wide range of mass spectrometry and space instrumentation applications.

Integrator-based charge detectors utilize capacitors to accumulate charges to generate voltages according to $V=Q/C$, where Q is the input charge and C the charge detector capacitance. The resulting voltage may then be subsequently amplified, filtered, and digitized for analysis.

FIG. 1 shows that while a direct realization of this idea entails a single shunt capacitor C 10 with one end connected to ground and the other end acting as the charge target, the circuit (usually an amplifier 12) sensing a voltage V 14 across the capacitor C inevitably introduces a parasitic capacitance Cp 16 that is in parallel to C. The parasitic capacitance may come from the amplifier's input device, packaging, PCB trace, cabling, shielding, etc. Parasitic capacitance Cp 16 may also vary across different components, temperature, bias voltage, and be nonlinear, thereby creating uncertainties in the effective total capacitance. This makes it difficult to precisely calculate the incident charge for an output voltage.

FIG. 2 shows that to solve this issue, a practical implementation of the charge detector typically assumes the alternative topology. Owing to the negative feedback, an amplifier 18 maintains a virtual ground at node X 20. Thus, any charge incident on node X 20 is transferred to the output node 22 of the amplifier 18, producing $V=-Q/C$. In contrast to the previous topology, an output voltage V 22 is much less sensitive to parasitic capacitance Cp 24 if the amplifier's open-loop gain is large. In the limit that the open-loop gain is infinity, Cp 24 has no effect on V 22 at all. Since the gain of the charge detector is $-1/C$, it is desirable to minimize C 26 so as to increase the gain to thereby relax the noise requirements of the subsequent stages, and to improve the overall SNR. In addition, active reset of the accumulated charge may be necessary in applications where the input charge is large to avoid amplifier saturation.

A differential implementation of the topology may reduce a charge detector circuit's sensitivity to noise and interference. These techniques are incorporated in the embodiments of the charge detector to follow.

The embodiments of the charge detector may be comprised of a Faraday cup that is coupled to a custom integrated charge amplifier fabricated using CMOS technology.

FIG. 3 shows the elements of the embodiments of the invention in a block diagram. A central element of the charge detector 30 is a charge amplifier 32. The charge amplifier 32 may have a set of programmable and non-programmable feedback capacitors and a feedback resistor on each of the differential inputs of the charge amplifier. Each set of the programmable and non-programmable feedback capacitors and the feedback resistor may be identical to the other.

In order to prevent damage to the sensitive charge detector 30, the embodiments may also include electrostatic discharge circuitry 36 on each of the differential inputs of the charge amplifier 32. Next, a common mode feedback (CMFB) circuit 38 is coupled to both outputs of the charge amplifier 32 and an output signal is sent to the charge amplifier to thereby dynamically control the gate voltage in the amplifier to force the output common mode to the reference voltage Vcm of the CMFB circuit. Finally, an output buffer 40 coupled to each of the outputs of the charge amplifier may increase the driving strength for large off-chip loads.

Figure 4:
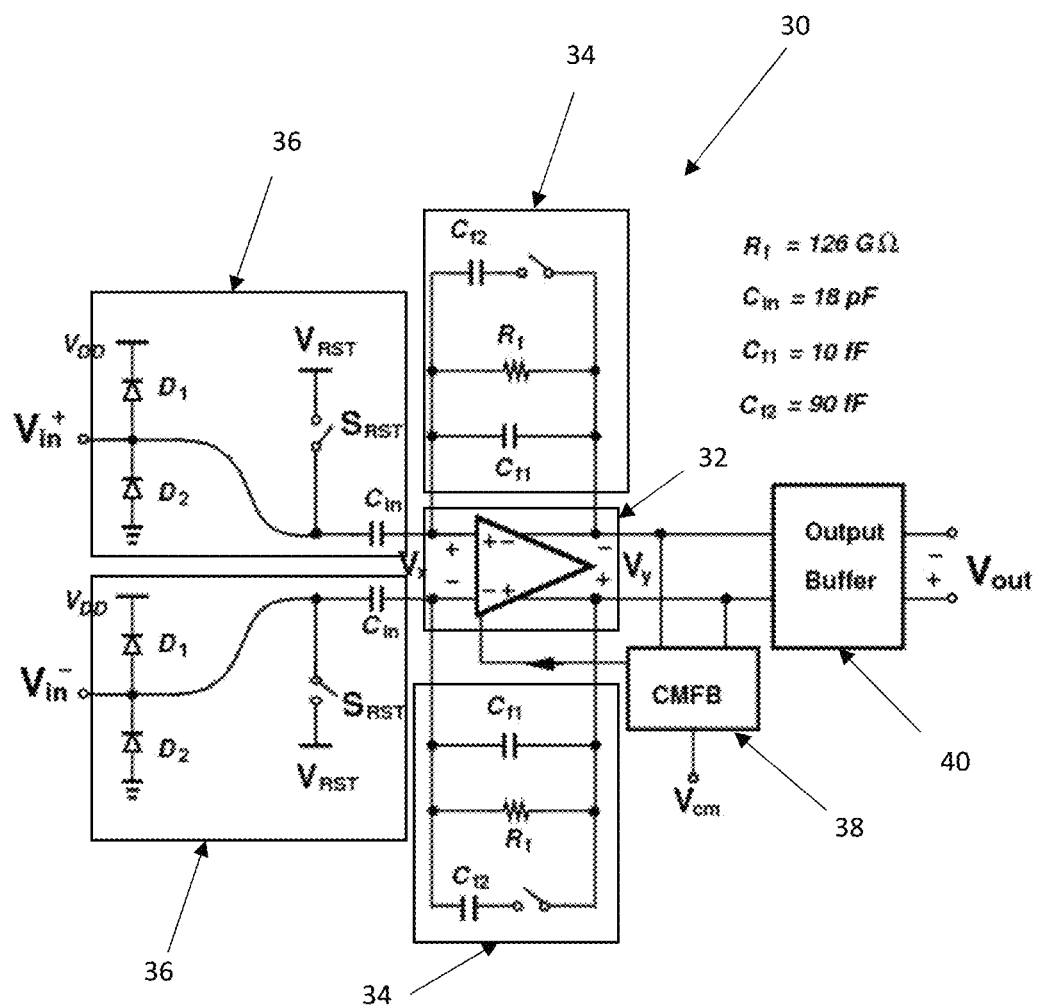
FIG. 4 is a detailed circuit diagram of the components in the charge detector, including a charge amplifier, identical and programmable feedback capacitors and feedback resistors, electrostatic discharge circuitry, a common mode feedback circuit, and an output buffer.
Figure 5A:
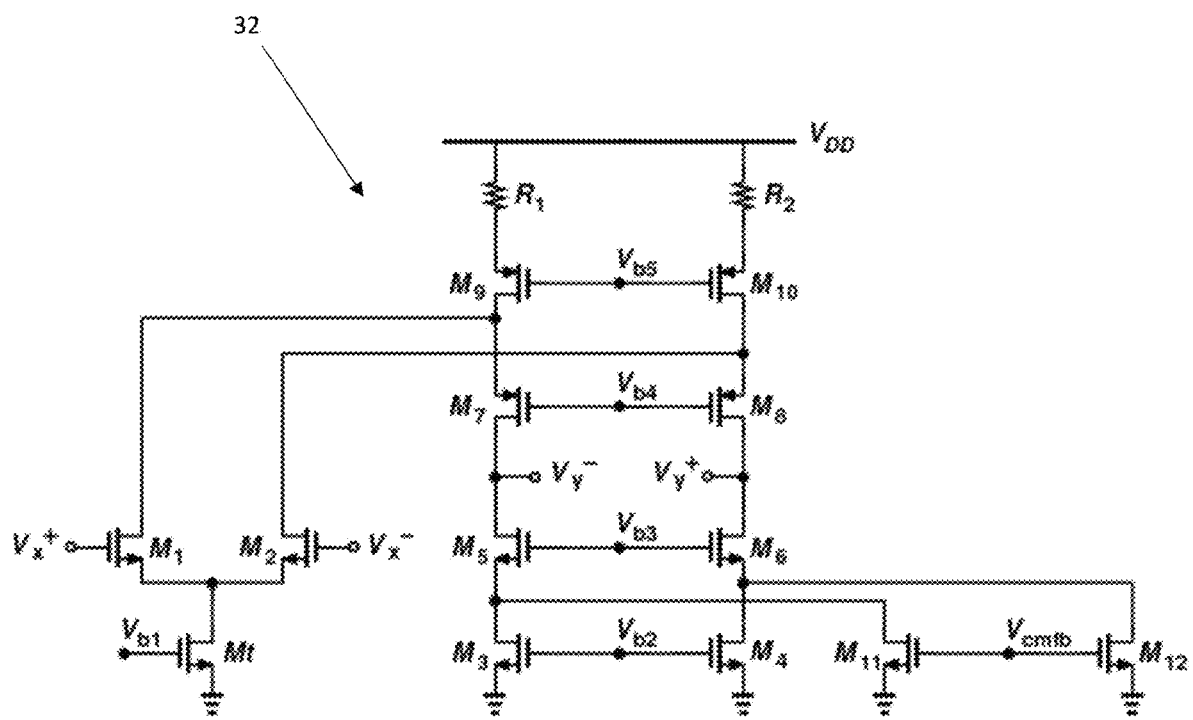
FIG. 5A is an expanded circuit diagram of the internal layout of the charge amplifier.
Figure 5B:
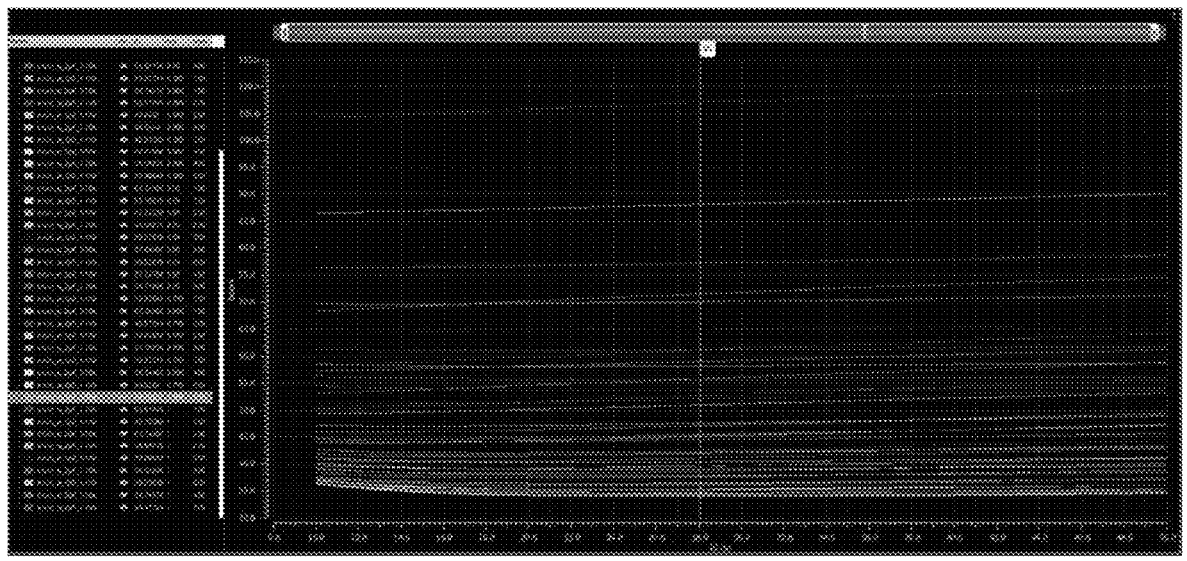
FIG. 5B is a view of a noise sweep for different values of transistor width, length, and tail current.
Figure 5C:
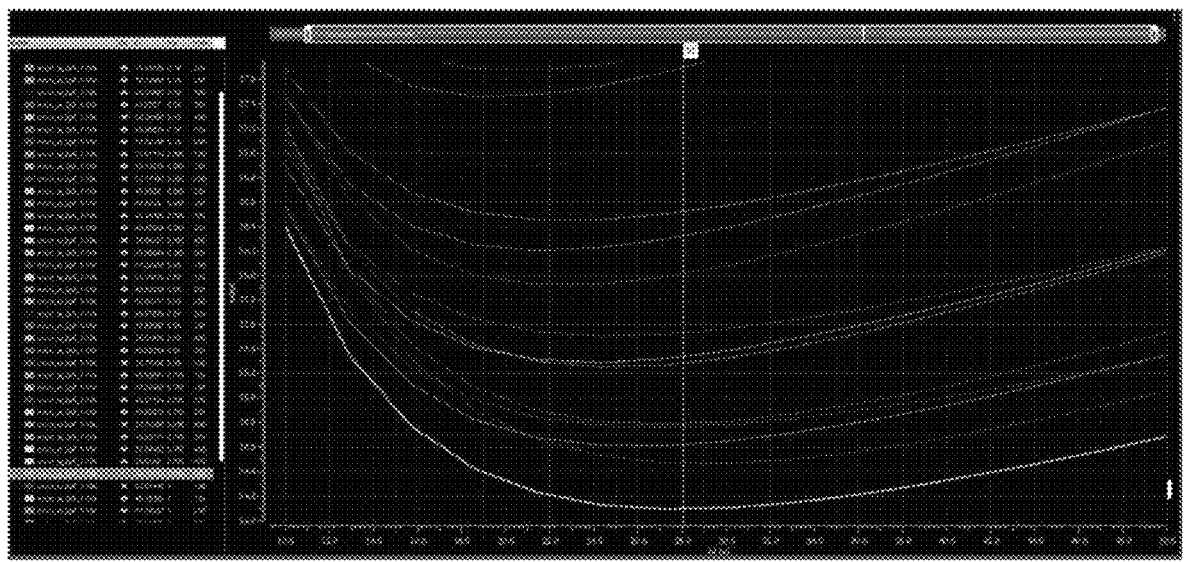
FIG. 5C is a close-up view of the noise sweep in FIG. 5B.
Figure 5D:
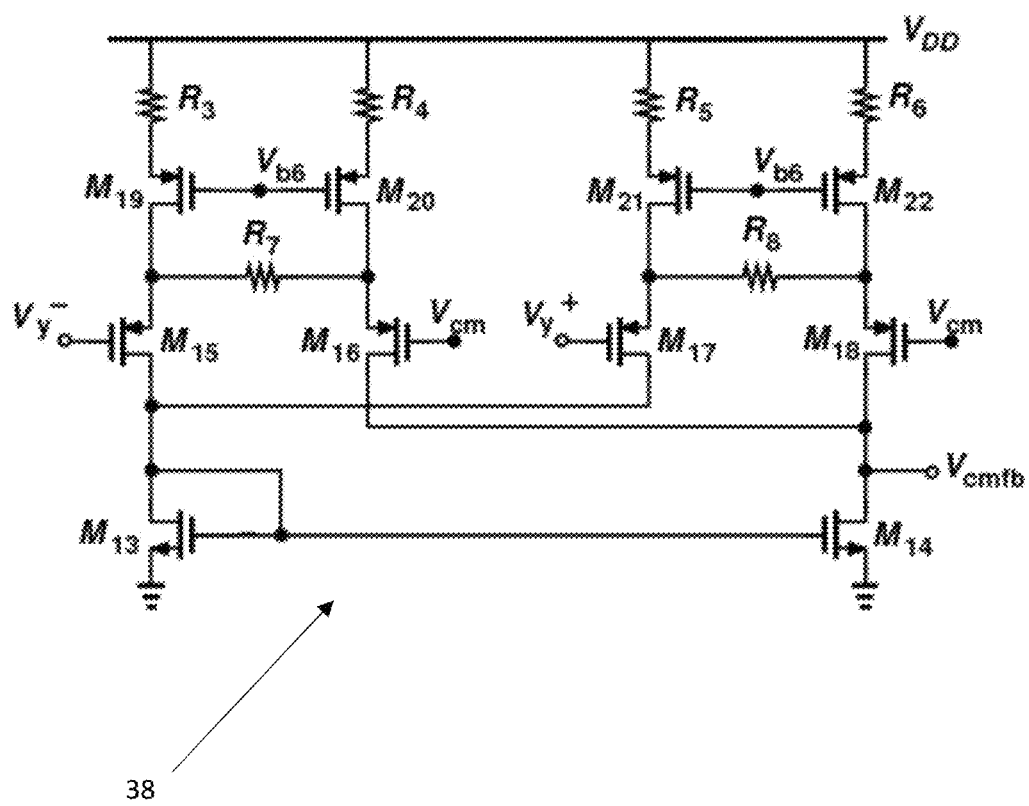
FIG. 5D is an expanded circuit diagram of the internal layout of the common mode feedback circuit.

FIGS. 4, 5A, and 5D provide a more detailed look at the charge detector circuitry 30 shown in the block diagram of FIG. 3. Beginning with FIG. 4, this figure shows additional detail regarding the charge detector 30 elements 32, 34, 36, 38 and 40, and represents a differential charge amplifier with active reset and small feedback capacitors.

First, it is noted that in the feedback capacitors and feedback resistors 34, feedback capacitors Cf1 and Cf2 set the charge-voltage gain of a closed-loop detector. Using an integrated structure with a metal-insulator-metal (MIM) stack, Cf1 may only be 10 fF, thus achieving at least an order of magnitude increase in the detector gain as compared to a discrete design that must rely on the smallest commercially available discrete capacitor (0.1 pF). The integrated feedback capacitors Cf1 and Cf2 also enjoy much tighter tolerances (about 5%) in comparison to discrete capacitors (50%), making it possible to have a vastly more consistent gain. The feedback capacitor Cf2 (shown here as 90 fF) may be programmably activated to lower the detector gain to avoid amplifier saturation for large inputs. The feedback resistor Rf establishes the input bias voltage of the amplifier. This feedback resistor may be realized using pseudo-resistors to obtain a large value of about 128 a) to thereby create a small high-pass corner of about 55 Hz for the input.

It should be understood that the values of Cf1 and Cf2 may be altered and the embodiments will still fall within the scope of the invention.

Electrostatic discharge (ESD) events during the handling and assembly process of the charge detector 30 (e.g. wire bonding the amplifier to a PCB) can blow out transistors and render the detector useless. In order to avoid transistor damage, two large AC-coupling capacitors Cin may be incorporated at the inputs to decouple the amplifier's virtual grounds (Vx nodes) to allow for the placement of ESD diodes (D1 and D2) to protect the sensitive elements. The diodes are designed to sense high voltages caused by ESD events and divert the resulting currents to the rail or ground. The ESD diodes D1 and D2 have been selected to have equal leakages such that the equilibrium voltage established between them is the same as the reset voltage VRST for quick settling.

It should be noted that while the embodiment shown in FIG. 4 gives selected values for Rf, Cin, C1 and C2, these values are for illustrative purposes only, and that they may be altered and the embodiments will still fall within the scope of the invention.

FIG. 5A is an expanded circuit diagram of the charge amplifier 32. The charge amplifier 32 may adopt a differential folded cascode topology for a large input common-mode range. The noise of the charge amplifier 32 is dominated by the differential transistor pair M1 and M2. Therefore, the sizes of transistors M1 and M2 and their bias current have been carefully selected to achieve low noise. Moreover, transistors M9 and M10 are degenerated by resistors R1 and R2 to thereby improve the noise performance. With the selected values for the transistors and resistors, the charge amplifier 32 exhibits an open-loop gain of 93 dB, open-loop bandwidth of 6.3 kHz, and an equivalent noise bandwidth of about 400 MHz.

An important feature of the embodiments of the invention is minimizing the noise generated by the charge amplifier 32. Therefore, the values of the differential transistor pair M1 and M2 may be an important factor in achieving the low noise of the charge detector 30 because the differential transistors limit the noise performance of the entire design, as well as contributing most of the noise.

Input parasitic capacitance also affects the noise of the charge amplifier 32. Thus, those skilled in the art may need to optimize the size of the differential transistor pair, as well as optimizing the tail current.

Optimizing the size of the differential transistor pair may be accomplished by constructing a Cadence testbench. The Cadence testbench allows a Cadence simulator to sweep input transistors sizes W and L at different tail currents. The input parasitic capacitance is composed of the detector capacitance and gate capacitance from the differential input transistors.

It is also necessary to select an off-chip detector capacitance for the differential input transistors. In the embodiments of the invention, a 2 pF off-chip detector capacitance was selected. It should be understood that if the off-chip capacitance will be different than 2 pF, then the values of W and L of the differential input transistors will change. Thus, optimization of the size of the differential input transistors must be determined for the desired off-chip capacitance.

FIG. 5B is a view of a simulation of input noise electron sweeps for different values of width (W) in micrometers, length (L) in micrometers and I (tail current). In the testbench, it first acquires output noise current through the IPRB at the Drain of the differential pair of input transistors M1 and M2. Then, the result is divided by gm to obtain the input noise voltage. Finally, the equivalent noise electron was converted through 2 pF detector capacitance and transistor gate capacitance Cgg for different values of W, L and I. The different transistor values used for a noise sweep include W from (100-500 um), L from (0.18-1 um) and Id (tail current) from (10 uA-50 uA).

FIG. 5C is a view of a display screen of an oscilloscope showing various noise sweeps results. The noise curves are integrated from 1-10 KHz where the flicker (1/f) noise dominates the spectrum. Since the charge amplifier has a low-pass characteristic, it is necessary to fine-tune the size of W and L after completing the cascade body of the charge amplifier due to bandwidth changes. After fine-tuning, the optimal characteristics of the differential input transistors are: W=440 um, L=0.18 um and Id=28 uA for the selected 2 pF off-chip detector capacitance.

It should be noted that while the embodiment shown in FIG. 5A gives an open-loop gain of 93 dB, open-loop bandwidth of 6.3 kHz, and an equivalent noise bandwidth of about 400 MHz, these values are for illustrative purposes only and the embodiments are not limited to these examples.

FIG. 5D is an expanded view of the common mode feedback (CMFB) circuit 38. The CMFB circuit 38 may sense the output voltages and dynamically adjust Vcmfb which controls the gate voltage of transistors M11 and M12 to force the output common mode to the reference voltage Vcm. The CMFB circuit 38 may function as an amplifier that has degenerated transistor input pairs (M15-M18) for stability and degenerated current sources (M19-M22) for low-noise. Vcm may be tuned from off-chip for easy debugging.

The output buffer 40 increases the driving strength for large off-chip loads while the reset switches SRST in the ESD circuitry 36 actively clear the accumulated charge by shorting the inputs to VRST.

This is in contrast to prior art designs with a passive reset that slowly dissipate the accumulated charge by the feedback resistor. An on-chip shift register may now generate a reset signal and programmable controls. The charge amplifier 32 may consume a total of 5.54 mW from a 1.8 V power supply.

FIG. 6 is a table showing an example of values that were used for the charge detector 30 shown in FIGS. 4, 5A and 5D. Specifically, the table includes values for the width and length of transistors and the values of some resistors in the charge detector 30. It should be understood that these are values selected for a 2 pF off-chip detector capacitance, and that the values of the transistors and resistors may change for a different off-chip detector capacitance. Accordingly, the table is showing examples only, and should not be considered as limiting the claims.

In the embodiments of the invention, a custom 2-layer PCB measuring 2.5"×3.75" has been designed to house the charge amplifier and the Faraday cup. A 1 cm×1 cm Faraday cup may be provided as the top PCB metal layer, which reduces integration complexity and minimizes the distance between the Faraday cup and the charge amplifier. This reduced routing distance lowers the parasitic capacitance of the amplifier input, thereby improving noise performance. The amplifier may be directly wire-bonded to the PCB to avoid parasitic capacitance from a chip package. SMA connectors may be used for the supply voltage and charge detector test inputs/outputs to minimize noise coupling. Furthermore, a discrete regulator on the PCB generates a low-noise 1.8 V power supply for the amplifier. Large electrolytic capacitors filter out low-frequency noise on the supply and bias lines, and smaller ceramic capacitors mounted close to the amplifier reject high-frequency noise. Potentiometers enable easy adjustment of bias voltages. Digital control signals from a PC may control the on-chip shift register and are filtered by LC filters to reduce noise.

Figure 7:
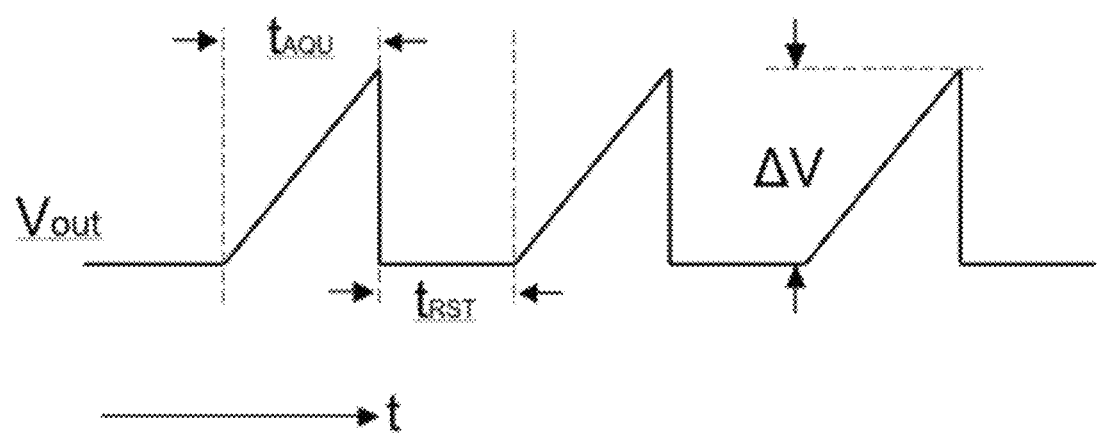
FIG. 7 is a charge detector output waveform for a constant, continuous input charge.

FIG. 7 illustrates the operational stages of the charge detector 30. The charge detector output waveform shown is for a constant, continuous input charge.

During reset (tRST), switches SRST shown in FIG. 4 short the amplifier inputs to VRST, thereby zeroing the amplifier differential output Vout. During acquisition (tAQU), the SRST switches are turned off, allowing an input charge incident on the Faraday cup which is connected to input Vin+ to be accumulated on the feedback capacitors Cf1, or Cf1 and Cf2. Input Vin− is coupled to an AC ground by a large capacitor so that the differential amplifier converts the single-ended input to a differential signal for robustness against supply noise, common-mode noise, RF interference, etc.

The charge detector has the option to be re-configured to accept a differential input charge by utilizing both inputs. For a constant continuous input charge, the output is a voltage ramp proportional to the integrated charge. At the end of the acquisition, the reset switches SRST are activated, thereby zeroing the voltage on Vout. The charge detector operates with a sample rate of up to 10 kHz with a user-determined acquisition duty cycle. The differential output may be digitized by an oscilloscope for analysis.

The total charge collected during one acquisition period may be calculated by taking the change in voltage ($\Delta V$) of Vout during the acquisition period and dividing it by the charge-voltage gain. Therefore, the charge-voltage gain of the charge detector must be accurately characterized for this calculation.

When charged particles do not directly impact a Faraday cup but instead induce charge on an electrode connected to the amplifier circuit (as is typical with CDMS analysis), there is no need for the active amplifier reset. When charge is induced on an electrode by a moving particle, mirrored charge first builds up as the particle approaches and then dissipates as the particle moves away. The net effect is a natural build-up of charge and then a return to a zero charge state without the need for resetting to avoid amplifier saturation.

Figure 8:
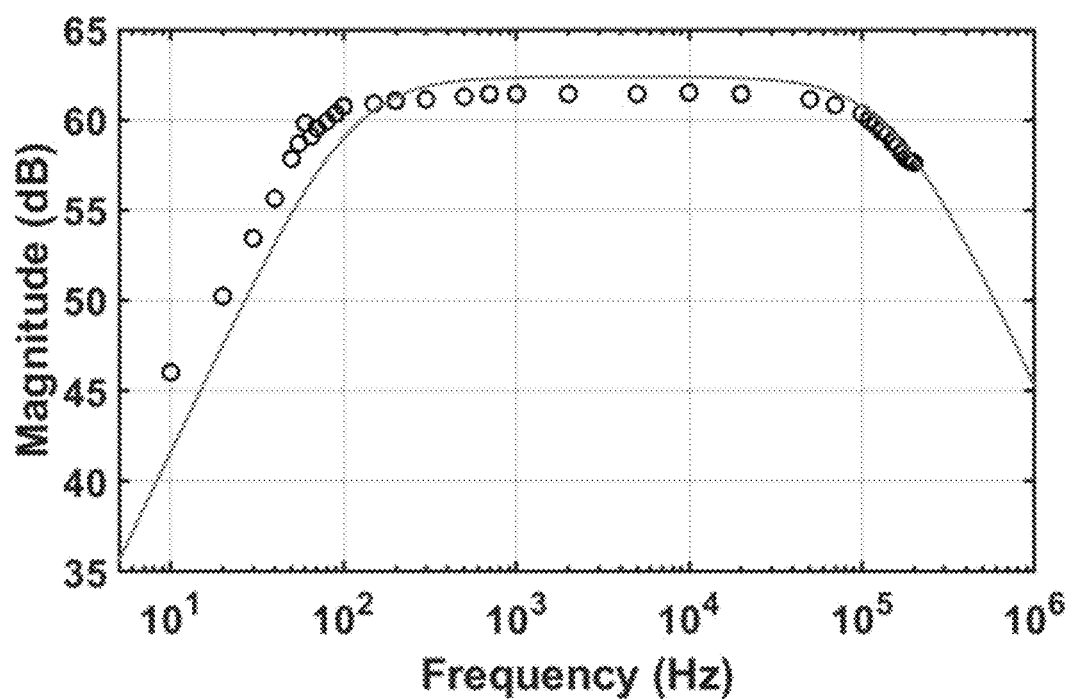
FIG. 8 is Simulated (line) and measured (points) voltage frequency response of the charge detector.

The frequency response of the amplifier in the embodiments of the invention was tested using a high-precision, low-voltage generator. The results of this test along with a comparison to simulated values is shown in FIG. 8. The response exhibits a bandpass profile where the mid-band gain is set by Cin/Cf1, the high-pass corner by 1/(RfCf1), and the lowpass corner by 1/(RoutCeff) where Rout is the output resistance of the amplifier and Ceff is the effective capacitive loading at the output of the amplifier.

As shown in FIG. 8, the amplifier demonstrates an excellent agreement between simulation (done using Cadence design and simulation tools) and measurements in both the gain (62 dB) and upper/lower corner frequencies (55 Hz/160 kHz).

Note that since the input is a voltage, this result is a voltage-input response which is different from the charge-input response described next.

The accumulated charge on a collection electrode connected to an amplifier may be calculated by taking the voltage change at the amplifier's output and dividing it by the charge-voltage gain. Therefore, the charge-voltage gain of the detector must be accurately characterized.

Conventional techniques for measuring charge-voltage gain apply a known voltage step to a calibration capacitor connected to the charge detector and then calculating the gain by dividing the corresponding charge detector output voltage by the product of the voltage step and the calibration capacitance. Consequently, the accuracy of this gain measurement relies on having an accurate capacitor value, which cannot be directly measured in an integrated design.

To overcome this problem, the embodiments of the invention include a new technique for determining the charge-voltage gain without having a known calibration capacitance. The technique employs a custom optoelectronic setup as shown in FIG. 9.

Figure 9:
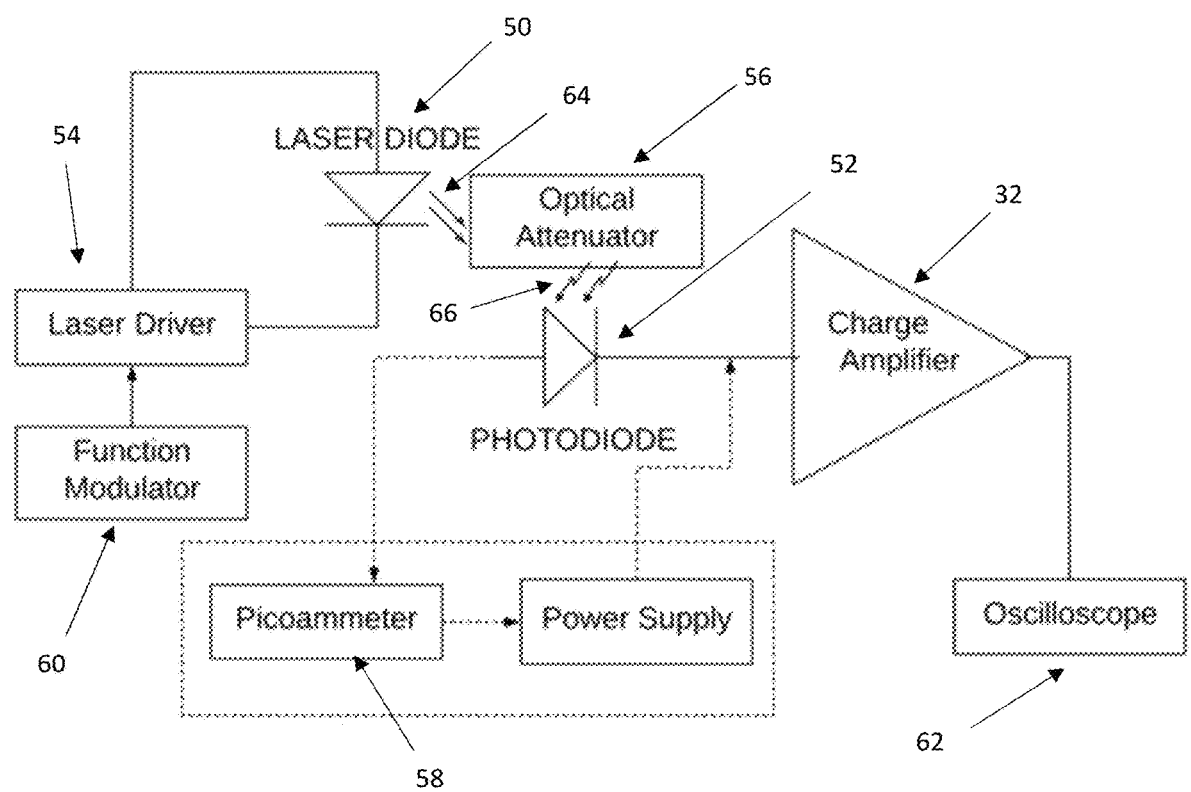
FIG. 9 is charge detector gain measurement setup using a custom optoelectronic system, wherein the dotted box represents additional circuitry for photodiode current measurements.

The purpose of the testing system shown in FIG. 9 is to generate an extremely low and adjustable current (e.g. in hundreds of pA), injecting it into the charge detector 30, and then observing the charge detector output to calculate the gain.

The testing system shown in FIG. 9 uses a low power, single-mode Fabry Perot laser diode 50 (about 1 mW) with an output wavelength of 635 nm. The photodiode 52 that generates the test current is an Opto Diode model ODD-1W, a red-light enhanced silicon diode, operating under a reverse bias of 0.9 V. Several different photodiodes of this model were used for testing and each of their parasitic capacitances was measured to be between 6.2 pF and 6.4 pF with leakage currents ranging from 27 pA to 33 pA. The parasitic capacitance was accounted for during data acquisition because it affects the gain of the charge amplifier 32.

During testing, a standard laser diode driver 54 supplied the laser diode with 50 mA of current. The light produced by the laser diode 50 was then guided through a fiber optic cable 64 and into an optical attenuator 56. This attenuated light was then guided to the photodiode 52 through another fiber optic cable 66. This fiber optic cable 66 was connected to the photodiode 52 by a black, 3D printed, double-sided socket. The socket attached the laser fiber cable 66 output to the top of the active area of the photodiode 52, which served to provide a secure connection as well as to block out ambient light, thereby allowing consistent measurements.

Obtaining an accurate gain measurement of the charge amplifier 32 was achieved through a two-step process. First, a picoammeter 58 measured the current through the reverse-biased photodiode 52. The measurements were taken at various laser attenuation levels in order to characterize the amount of current flowing from the photodiode 52. To avoid saturating the charge detector 30, the current was measured at laser attenuation levels between 30 to 40 dB. At these levels, the measured current ranged from around 100 pA to 775 pA.

Once the current had been measured, the picoammeter 58 was replaced with the charge detector 30. The gain of the charge amplifier 32 was calculated using equations 1-3 below, with tAQU being the time duration of the acquisition period, I the input current measured by the picoammeter 58, q the elementary charge, and n the total number of elementary charges accumulated during acquisition.

$$Q_{in} = t_{AQU} \times I \quad \text{Equation 1:}$$

$$n = Q_{in}/q \quad \text{Equation 2:}$$

$$GAIN = \Delta V/n \quad \text{Equation 3:}$$

The minimum amount of charge used was limited by the dark current of the photodiode 52, which was 33 pA. With a reset frequency of 10 kHz, and an approximately 50% acquisition duty cycle, the minimum number of charges equates to 9,476.

Figure 10:
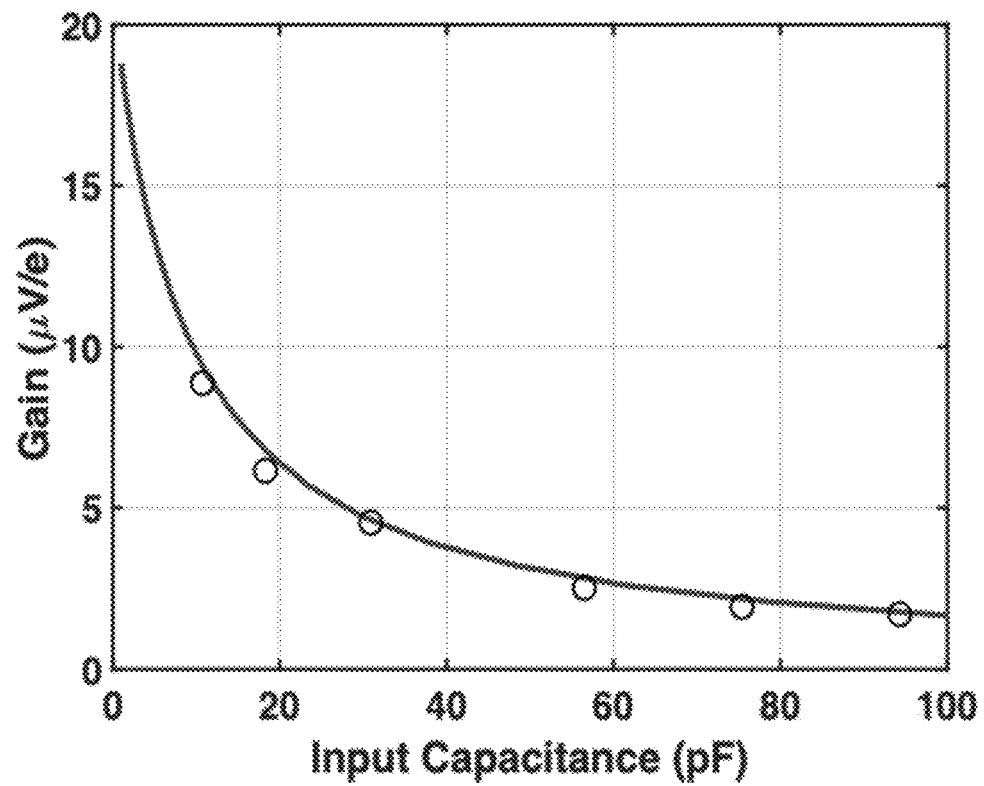
FIG. 10 is charge-voltage gain versus detector input capacitance. Simulation results are shown as a solid line and measurements as points.

The gain of the charge detector 30 was measured for a range of input capacitances which model the loading from the Faraday cup and other PCB components. This allows the user to predict the detector gain for a given input loading. The input capacitance was swept by connecting discrete capacitors in parallel with the photodiode 52. The gain was then measured at each capacitance point using the optoelectronic setup described in FIG. 9. The results are shown in FIG. 10.

Due to the parasitic capacitance of the photodiode 52, as well as the capacitance of the PCB, the minimum input capacitance tested was 11 pF. The highest gain measured was 8.9 µV/e− at 11 pF and it decreases to 1.7 µV/e− at 94 pF. The maximum difference between measured and simulated (using Cadence design software) gains from this sweep was 11%. Such a small discrepancy may be explained by errors of the feedback capacitors in the charge detector 30, as well as system noise and instrumentation errors.

The noise of the charge detector 30 was measured by acquiring the charge detector output with a floating input node and dividing the output RMS value by the charge detector gain. The output RMS noise was measured using an oscilloscope 62 with a bandwidth of 2 GHz over a time window of just under 10 ms. Similar to the gain measurement, the input capacitance was varied to study its effect on the noise.

Figure 11:
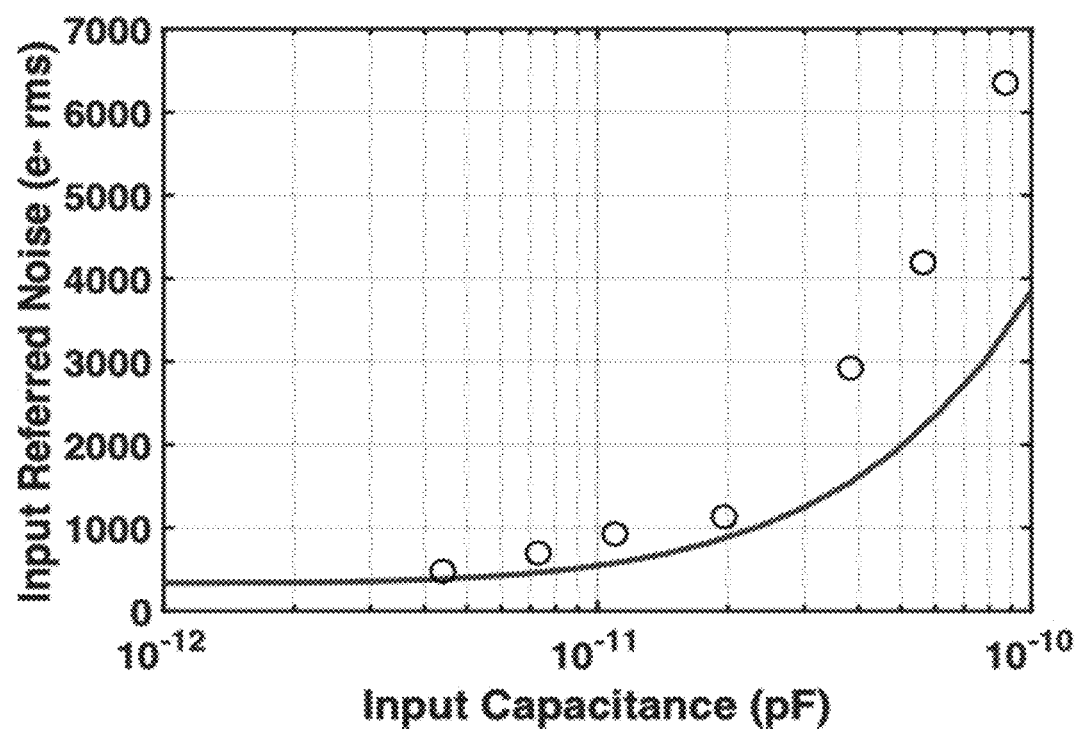
FIG. 11 is Input-referred noise versus detector input capacitance. Simulation results are shown as a solid line and measured values as points

FIG. 11 shows the result of this measurement. The charge detector 30 exhibits a noise of 475 e− with a 4.4 pF (simulated noise floor at this input capacitance is 381 e−) load and it increases to 6352 e− at 87 pF. The measured noise shows larger deviation from the simulation for large input capacitances. This may be due to the increased sensitivity from the exponential profile of the noise curve as the input capacitance increases, or from external noise picked up from the test input capacitors. It is worth noting that should the input capacitance be reduced to 1 pF, the noise floor would fall to 334 e−.

To validate the dynamic performance of the charge detector 30, the input current from the system shown in FIG. 9 was varied by modulating the laser diode 50. This test helped to determine the charge detector's ability to recreate a time-varying input, such as from a mass spectrometer. A function generator was used to apply a square wave signal of 250 mVpp at 50 Hz to the laser driver 54. To confirm that the current output of the photodiode 52 did indeed match the modulating signal, a transimpedance amplifier (TIA) was connected to the photodiode to record the current.

Figure 12A:
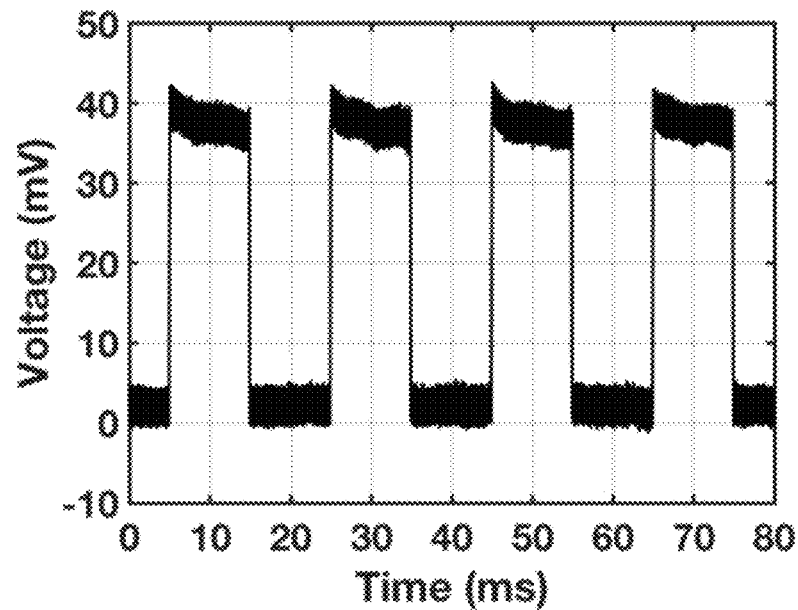
FIG. 12A is modulated photodiode current as measured by a transimpedance amplifier.

For this measurement, the laser signal was optically attenuated by 15 dB, producing a high current level of 73 nA and a low current level of 49 pA through the photodiode 52. The TIA exhibited a current-to-voltage gain of roughly 550 kV/A. The voltage output of the TIA is shown in FIG. 12A, confirming the correct waveform.

Figure 13A:
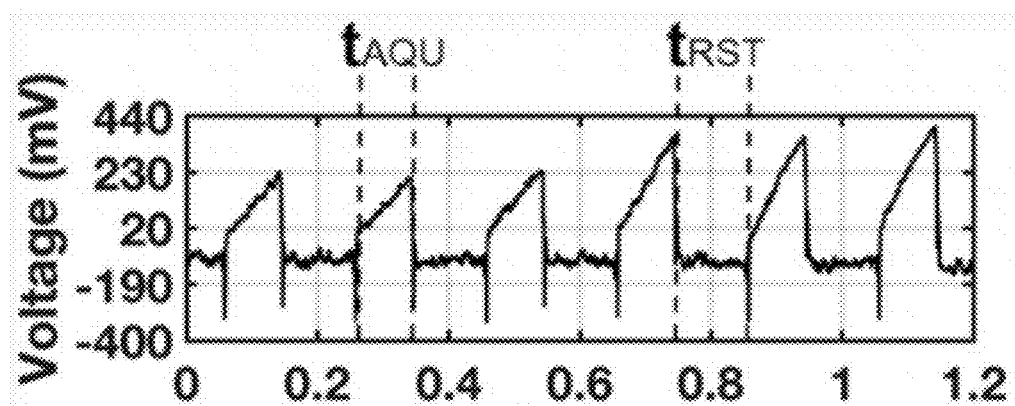
FIG. 13A is raw output of the detector from a step input current over six acquisition cycles.
Figure 13B:
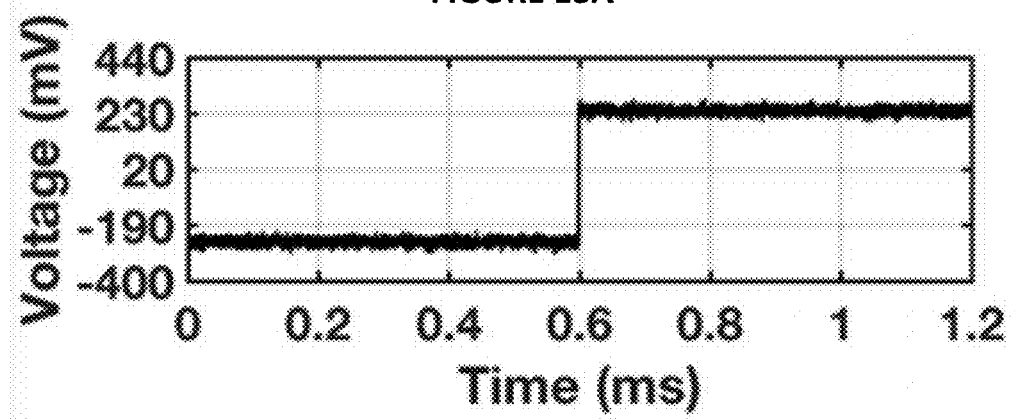
FIG. 13B is a signal taken from a function generator that was used to modulate the laser driver.

The TIA was then replaced by the charge detector 30 of the present invention. In order to avoid saturating the charge amplifier 32, attenuation levels needed to be much higher than those used in the TIA tests. The following tests were performed at an optical attenuation level of 45 dB, thus the current input to the charge detector 30 was 30 dB less than that seen by the TIA. The resulting modulated input signal featured a current square wave with a 49 pA low level and 74 pA high level. The detector output waveform is shown in FIG. 13A. The figures show the raw output of the charge detector 30 from a step input current over six acquisition cycles. FIG. 13B shows the signal taken from the function modulator (signal generator) 60 that was used to modulate the laser driver 54.

Figure 12B:
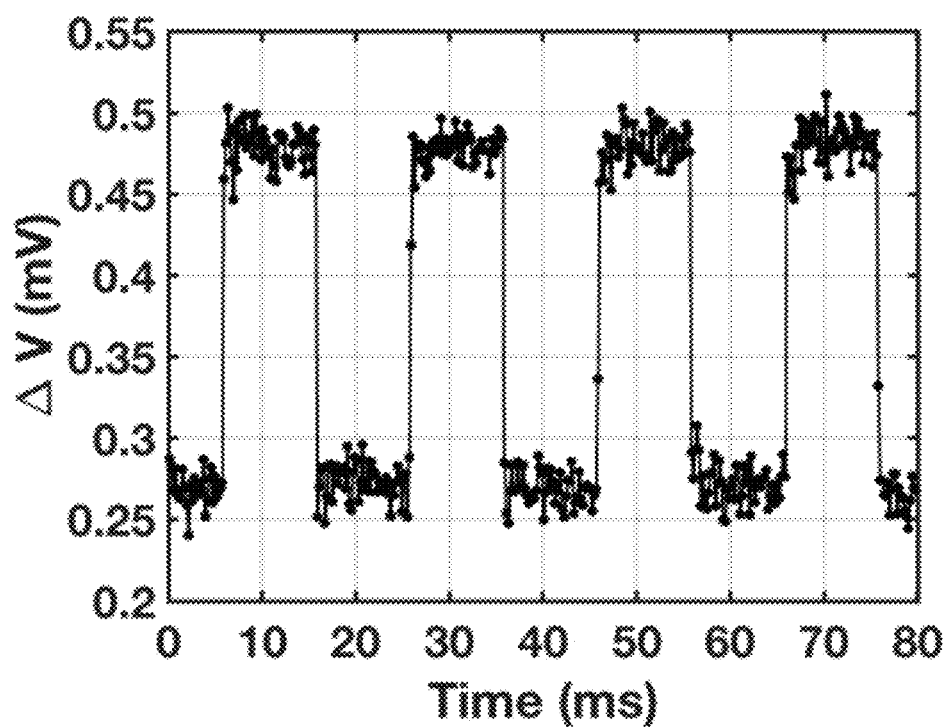
FIG. 12B is detector response to a modulated input current over 400 acquisition cycles. The detector response has been processed by extracting $\Delta V$'s.

The change in the amplitudes of the sawtooth waveforms coincided with the change in the input current (when the modulating voltage stepped up) as expected. To accurately measure the ΔV's of the output, the output was segmented by a sync signal that indicates the start and end times of the acquisition period. The ΔV in each of these acquisition periods was extracted by a processing program resulting in the waveform shown in FIG. 12B. The processed output shows a square-wave response from the square-wave input in agreement with the TIA waveform, validating the dynamic performance of the charge detector 30. The voltage offset from zero of the square wave shown in FIG. 12B is the result of the dark current produced by the photodiode 52, while in FIG. 12A no such offset is apparent due to the drastically higher levels of current used in those tests.

Figure 14:
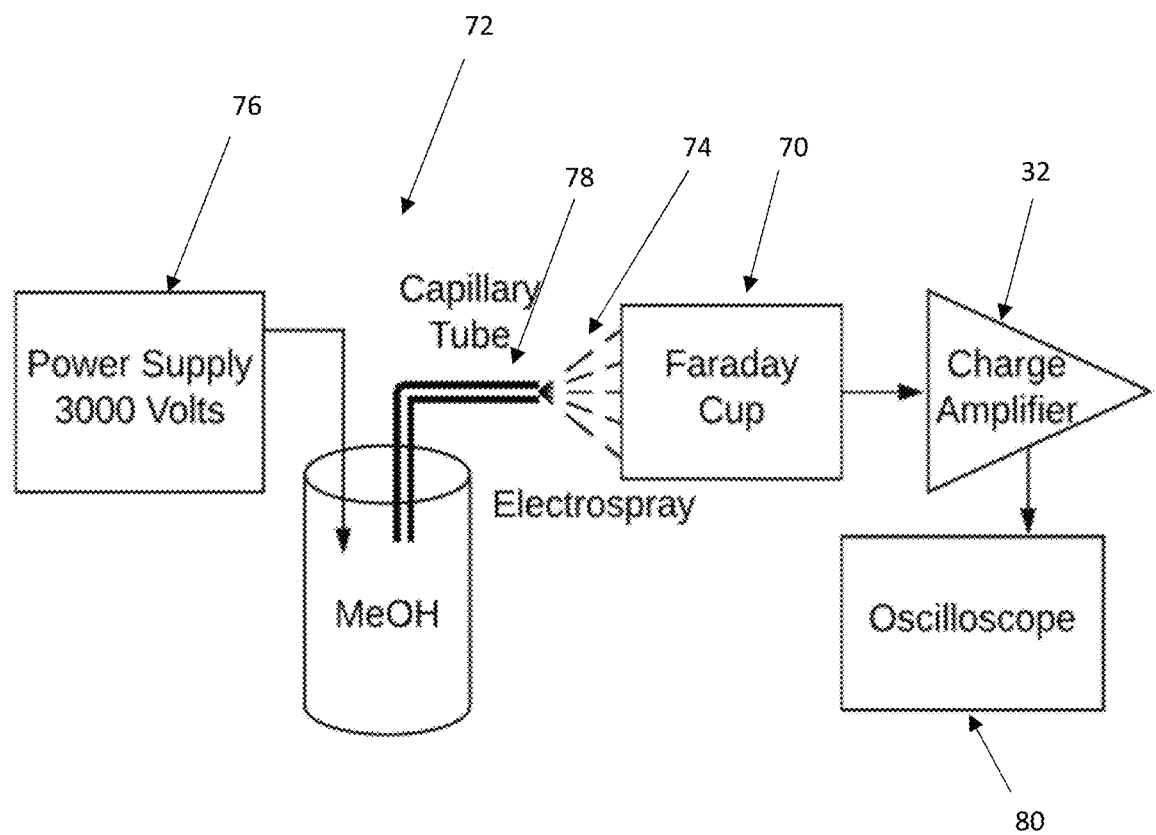
FIG. 14 is a block diagram of a free-space input charge test setup using electrospray.

In order to test the charge detector's ability to detect physical charges impacting on the Faraday cup collector 70, an electrospray system 72 was utilized to produce charged methanol (MeOH) droplets 74 as depicted in FIG. 14. The charged droplets 74 were projected to the Faraday cup 70 by a 3,000 V power supply 76 through a capillary tube 78. To reduce noise, the charge detector 30 was placed in an aluminum shielding box and the capillary tube 78 was inserted into the box via a small opening.

Figure 15:
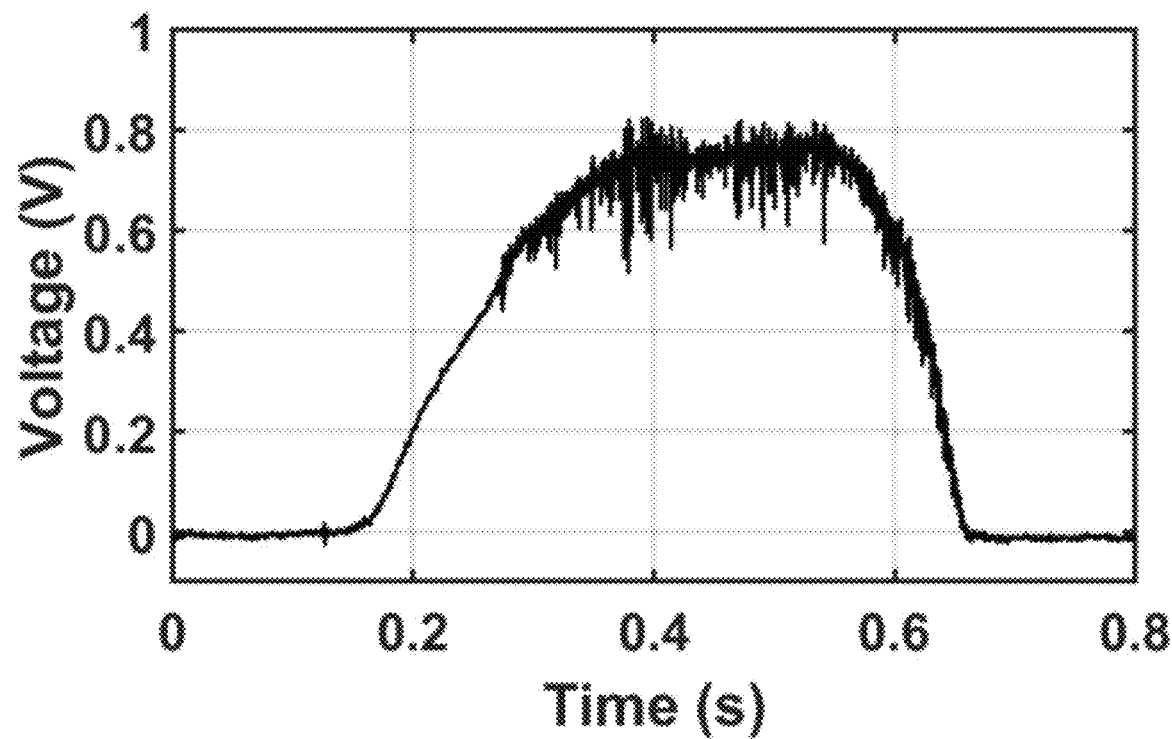
FIG. 15 is a charge detector response to an electrospray pulse at a selected sample rate and acquisition duty cycle.

Measurements were made at the sample rate of 2.5 kHz, 5 kHz, and 10 kHz. Different duty cycles of the acquisition period were also tested. At 10 kHz, for example, a 25% acquisition duty cycle was found to be necessary to fully discharge the Faraday cup 70. By redirecting the orientation of the capillary tube 78, a small pulse of droplets 74 less than a second in duration was generated. The charge detector response to the charge pulse was recorded with an oscilloscope 80 and processed using the same method described earlier. The processed result is shown in a graph FIG. 15. The rise and fall of the response are both relatively smooth, as is expected. An average of 56,000 charged droplets hit the Faraday cup 70 during each acquisition cycle in the center of the pulse, which is a reasonable rate. The graph was obtained using a 10 KHz sample rate and 25% acquisition duty cycle.

Because the electrospray process system 72 used is unable to produce a steady stream of ions, which are variable both in quantity and charge, there is some expected variation along the center of the pulse. This test verifies that the charge detector 30 can successfully detect free-space charges and be reset. Without the active reset, the dynamic range of the charge detector 30 would be much smaller as the input particles would saturate the charge amplifier 32.

Thus, the embodiments of the invention and the testing described above show that a charge detector 30 has been created with the maximum experimental gain of just under 9 µV/e− and an observed single-pass noise floor of 475 e− rms (with the potential to fall to 334 e− given a lower input capacitance).

In summary, the embodiments of the invention may be defined as the following. The embodiments may be a method for operating a low power, differential, solid-state charge detector with active reset with the method comprised of the steps of providing a charge collector, providing a charge amplifier having differential inputs with transistors to thereby reduce sensitivity to noise and interference, wherein the charge collector is coupled to the charge amplifier, providing a first feedback capacitor in parallel with a feedback resistor on each of the differential inputs of the charge amplifier, and wherein the first feedback capacitor is less than 50 fFarads.

An important feature may be optimizing the differential input transistors of the charge amplifier to thereby decrease the noise of the charge detector, providing an active reset switch on the differential inputs for performing an active reset of the charge amplifier, providing a common mode feedback circuit coupled to both outputs of the charge amplifier, resetting the charge amplifier using the active reset switch, and then measuring the charge on the charge collector over a period of time at the outputs of the charge amplifier.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims. It is the express intention of the applicant not to invoke 35 U.S.C. § 112, paragraph 6 for any limitations of any of the claims herein, except for those in which the claim expressly uses the words 'means for' together with an associated function.

What is claimed is:

1. A method for operating a low power, differential, solid-state charge detector with active reset, said method comprised of:

providing a charge collector;

providing a charge amplifier having differential inputs to thereby reduce sensitivity to noise and interference, wherein the charge collector is coupled to the charge amplifier;

providing a first feedback capacitor in parallel with a feedback resistor on each of the differential inputs of the charge amplifier, wherein the first feedback capacitor is less than 50 fFarads;

providing an active reset switch on the differential inputs for performing an active reset of the charge amplifier;

providing a common mode feedback circuit coupled to both outputs of the charge amplifier;

resetting the charge amplifier using the active reset switch; and measuring the charge on the charge collector over a period of time at the outputs of the charge amplifier.

2. The method as defined in claim 1 wherein the method further comprises providing a low power source for the charge amplifier by:

providing a power supply for the charge amplifier that is less than 20 volts; and coupling the power supply to the charge amplifier.

3. The method as defined in claim 1 wherein the method further comprises operating the charge detector at a pressure that is above a vacuum by operating the charge detector at ambient atmospheric pressure.

4. The method as defined in claim 1 wherein the method further comprises decreasing the gain of the charge amplifier by:

providing a second feedback capacitor that is in parallel with the first feedback capacitor, wherein the second feedback is programmable such that the second feedback capacitor is only made to be in parallel with first feedback capacitor if a programmable switch is closed; and closing the programmable switch to thereby decrease the gain of the charge amplifier.

5. The method as defined in claim 1 wherein the method further comprises preventing the charge amplifier from becoming saturated when the frequency of the input charge is high by:

detecting that the charge amplifier is approaching saturation from a high frequency input signal;

resetting the charge amplifier using the active reset switch before the charge amplifier is saturated; and continuing to detect the charge from the charge collector.

6. The method as defined in claim 1 wherein the method further comprises preventing the charge amplifier from becoming saturated when large input signal is being detected by:

detecting that the charge amplifier is approaching saturation from a large input signal;

resetting the charge amplifier using the active reset switch before the charge amplifier is saturated; and continuing to detect the charge from the charge collector.

7. The method as defined in claim 1 wherein the method further comprises preventing damage to the charge detector from an electrostatic discharge by providing electrostatic discharge circuitry on each of the differential inputs of the charge amplifier.

8. The method as defined in claim 7 wherein the step of preventing damage to the charge detector from an electrostatic discharge further comprises:

providing an AC-coupling capacitor for decoupling the virtual grounds of the charge amplifier on each of the charge amplifier differential inputs; and providing two electrostatic discharge diodes coupled to the AC-coupling capacitor for diverting current to a power rail or ground when an electrostatic discharge event occurs.

9. The method as defined in claim 1 wherein the step of providing a charge amplifier having differential inputs further comprises providing the charge amplifier with a differential folded cascode topology to thereby increase an input common-mode range.

10. The method as defined in claim 1 wherein the method further comprises optimizing the differential input transistors of the charge amplifier to thereby decrease the noise of the charge detector.

11. The method as defined in claim 10 wherein the step of optimizing the differential input transistors of the charge amplifier further comprises:
   selecting an off-chip detector capacitance for the differential input transistors; and
   selecting a transistor width, a transistor length and a transistor tail current of the differential input transistors that generates the lowest noise from the charge amplifier.

12. The method as defined in claim 11 wherein the step of optimizing the differential input transistors of the charge amplifier further comprises:
   constructing a testbench simulator;
   sweeping a plurality of different differential input transistor sizes and tail currents through the simulator; and
   determining which differential input transistor size and tail current generates the lowest noise from the charge amplifier.

13. A low-power, differential, solid-state charge detector with active reset, said detector comprised of:
   a charge collector;
   a charge amplifier having differential inputs and two outputs, wherein the charge collector is coupled to the charge amplifier;
   a first feedback capacitor in parallel with a feedback resistor on each of the differential inputs of the charge amplifier, wherein the first feedback capacitor is less than 50 fFarads;
   an active reset switch on the differential inputs for performing an active reset of the charge amplifier; and
   a common mode feedback circuit coupled to both outputs of the charge amplifier.

14. The charge detector as defined in claim 13 wherein the charge detector is further comprised of a low-power source for the charge amplifier, wherein the low-power source is less than 20 volts.

15. The charge detector as defined in claim 13 wherein the charge detector is further characterized by not reducing an operating pressure of the charge detector such that the charge detector operates at ambient atmospheric pressure.

16. The charge detector as defined in claim 13 wherein the charge detector is further comprised of:
   a programmable switch; and
   a second feedback capacitor that is in parallel with the first feedback capacitor only when the programmable switch is closed.

17. The charge detector as defined in claim 13 wherein the charge detector is further comprised of an electrostatic discharge circuit on each of the differential inputs of the charge amplifier.

18. The charge detector as defined in claim 17 wherein each electrostatic discharge circuit is further comprised of:
   an AC-coupling capacitor coupled to the charge amplifier differential input; and
   two electrostatic discharge diodes coupled to the AC-coupling capacitor for diverting current to a power rail or ground when an electrostatic discharge event occurs.

19. The charge detector as defined in claim 13 wherein the charge amplifier is further comprised of a differential folded cascode topology to thereby increase an input common-mode range.

20. The charge detector as defined in claim 13 wherein the charge detector is further comprised of selecting a transistor width, a transistor length and a transistor tail current of the differential input transistors that generates the lowest noise from the charge amplifier.

21. The charge detector as defined in claim 13 wherein the charge detector is further comprised of an output buffer coupled to each of the outputs of the charge amplifier.

22. The charge detector as defined in claim 13, wherein the charge detector has a sample rate of less than 11 kHz.

23. A method for operating a low power, differential, solid-state charge detector with active reset, said method comprised of:
   providing a charge collector;
   providing a charge amplifier having differential inputs with transistors to thereby reduce sensitivity to noise and interference, wherein the charge collector is coupled to the charge amplifier;
   providing a first feedback capacitor in parallel with a feedback resistor on each of the differential inputs of the charge amplifier, wherein the first feedback capacitor is less than 50 fFarads;
   optimizing the differential input transistors of the charge amplifier to thereby decrease the noise of the charge detector;
   providing an active reset switch on the differential inputs for performing an active reset of the charge amplifier;
   providing a common mode feedback circuit coupled to both outputs of the charge amplifier;
   resetting the charge amplifier using the active reset switch; and
   measuring the charge on the charge collector over a period of time at the outputs of the charge amplifier.

24. The method as defined in claim 23 wherein the method further comprises providing a low power source for the charge amplifier by:
   providing a power supply for the charge amplifier that is less than 20 volts; and
   coupling the power supply to the charge amplifier.

25. The method as defined in claim 23 wherein the method further comprises operating the charge detector at a pressure that is above a vacuum by operating the charge detector at ambient atmospheric pressure.

26. The method as defined in claim 23 wherein the method further comprises decreasing the gain of the charge amplifier by:
   providing a second feedback capacitor that is in parallel with the first feedback capacitor, wherein the second feedback is programmable such that the second feedback capacitor is only in parallel with first feedback capacitor if a programmable switch is closed; and
   closing the programmable switch to thereby decrease the gain of the charge amplifier.

27. The method as defined in claim 23 wherein the method further comprises preventing the charge amplifier from becoming saturated when the frequency of the input charge is high by:
   detecting that the charge amplifier is approaching saturation from a high frequency input signal;

resetting the charge amplifier using the active reset switch before the charge amplifier is saturated; and
continuing to detect the charge from the charge collector.

28. The method as defined in claim 23 wherein the method further comprises preventing the charge amplifier from becoming saturated when a large input signal is high by:
   detecting that the charge amplifier is approaching saturation from a large input signal;
   resetting the charge amplifier using the active reset switch before the charge amplifier is saturated; and
   continuing to detect the charge from the charge collector.

29. The method as defined in claim 23 wherein the method further comprises preventing damage to the charge detector from an electrostatic discharge by providing electrostatic discharge circuitry on each of the differential inputs of the charge amplifier.

30. The method as defined in claim 29 wherein the step of preventing damage to the charge detector from an electrostatic discharge further comprises:
   providing an AC-coupling capacitor for decoupling the virtual grounds of the charge amplifier on each of the charge amplifier differential inputs; and
   providing two electrostatic discharge diodes coupled to the AC-coupling capacitor for diverting current to a power rail or ground when an electrostatic discharge event occurs.

31. The method as defined in claim 23 wherein the step of providing a charge amplifier having differential inputs further comprises providing the charge amplifier with a differential folded cascode topology to thereby increase an input common-mode range.

32. The method as defined in claim 23 wherein the step of optimizing the differential input transistors of the charge amplifier further comprises:
   selecting an off-chip detector capacitance for the differential input transistors; and
   selecting a transistor width, a transistor length and a transistor tail current of the differential input transistors that generates the lowest noise from the charge amplifier.

33. The method as defined in claim 32 wherein the step of optimizing the differential input transistors of the charge amplifier further comprises:
   constructing a testbench simulator;
   sweeping a plurality of different differential input transistor sizes and tail currents through the simulator; and
   determining which differential input transistor size and tail current generates the lowest noise from the charge amplifier.

34. A low-power, differential, solid-state charge detector with active reset, said detector comprised of:
   a charge collector;
   a charge amplifier having differential inputs and two outputs, wherein the charge collector is coupled to the charge amplifier, wherein the differential inputs are comprised of two differential transistors, and selecting a transistor width, a transistor length and a transistor tail current of the differential input transistors that generates the lowest noise from the charge amplifier;
   a first feedback capacitor in parallel with a feedback resistor on each of the differential inputs of the charge amplifier, wherein the first feedback capacitor is less than 50 fFarads;
   an active reset switch on the differential inputs for performing an active reset of the charge amplifier; and
   a common mode feedback circuit coupled to both outputs of the charge amplifier.

35. The charge detector as defined in claim 34 wherein the charge detector is further comprised of a low-power source for the charge amplifier, wherein the low-power source is less than 20 volts.

36. The charge detector as defined in claim 34 wherein the charge detector is further characterized by not reducing an operating pressure of the charge detector such that the charge detector operates at ambient atmospheric pressure.

37. The charge detector as defined in claim 34 wherein the charge detector is further comprised of:
   a programmable switch; and
   a second feedback capacitor that is in parallel with the first feedback capacitor only when the programmable switch is closed.

38. The charge detector as defined in claim 34 wherein the charge detector is further comprised of an electrostatic discharge circuit on each of the differential inputs of the charge amplifier.

39. The charge detector as defined in claim 38 wherein each electrostatic discharge circuit is further comprised of:
   an AC-coupling capacitor coupled to the charge amplifier differential input; and
   two electrostatic discharge diodes coupled to the AC-coupling capacitor for diverting current to a power rail or ground when an electrostatic discharge event occurs.

40. The charge detector as defined in claim 34 wherein the charge amplifier is further comprised of a differential folded cascode topology to thereby increase an input common-mode range.

41. The charge detector as defined in claim 34 wherein the charge detector is further comprised of an output buffer coupled to each of the outputs of the charge amplifier.

42. The charge detector as defined in claim 34, wherein the charge detector has a sample rate of less than 11 kHz.

* * * * *